(12) United States Patent
Goud et al.

(10) Patent No.: US 10,779,404 B2
(45) Date of Patent: Sep. 15, 2020

(54) CIRCUIT BOARD PAD RESONANCE CONTROL SYSTEM

(71) Applicant: Dell Products L.P., Round Rock, TX (US)

(72) Inventors: Vasa Mallikarjun Goud, Secunderabad (IN); Chun-Lin Liao, Taipei (TW); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/951,593

(22) Filed: Apr. 12, 2018

(65) Prior Publication Data

US 2019/0320529 A1   Oct. 17, 2019

(51) Int. Cl.
*H05K 1/11* (2006.01)
*H05K 3/40* (2006.01)
*H05K 3/24* (2006.01)
*H05K 1/02* (2006.01)

(52) U.S. Cl.
CPC .......... *H05K 1/111* (2013.01); *H05K 1/0228* (2013.01); *H05K 3/244* (2013.01); *H05K 3/4007* (2013.01); *H05K 2201/099* (2013.01); *H05K 2201/09445* (2013.01); *H05K 2201/1031* (2013.01); *H05K 2203/0307* (2013.01); *H05K 2203/072* (2013.01); *H05K 2203/0726* (2013.01); *H05K 2203/171* (2013.01)

(58) Field of Classification Search
CPC .......... H05K 1/111; H05K 2203/0307; H05K 2201/0373; H05K 3/4007; H05K 3/184; H05K 3/3452; H05K 3/244; H05K 1/0228; H05K 2201/099; H05K 2201/1031; H05K 2203/072; H05K 2203/0726; H05K 2203/171; H05K 2201/09445

See application file for complete search history.

(56) References Cited

U.S. PATENT DOCUMENTS

| | | | |
|---|---|---|---|
| 6,043,150 A * | 3/2000 | Downes, Jr. ........ | H01L 21/4853 174/255 |
| 9,673,131 B2 * | 6/2017 | Hu ........................ | H01L 21/561 |
| 2004/0007384 A1 * | 1/2004 | Soga .................... | H05K 3/3484 174/260 |
| 2009/0085207 A1 * | 4/2009 | Matsunami ....... | H01L 23/49811 257/738 |
| 2015/0034366 A1 * | 2/2015 | Yoshioka ............... | H05K 1/111 174/251 |

* cited by examiner

*Primary Examiner* — James Wu
(74) *Attorney, Agent, or Firm* — Haynes and Boone, LLP

(57) ABSTRACT

A circuit board pad resonance control system includes a board. A signal transmission line is included on the board. A plurality of connector pads are positioned on the board. A first connector pad receives the signal transmission line adjacent a first end of that connector pad. The first connector pad includes a mounting surface that mounts directly to a coupling element that is configured to couple a subsystem to the board, and reduces a resonance that is produced by an open portion of a signal transmission path that is created when the coupling element is directly mounted to the mounting surface of the first connector pad in a first orientation. In a specific example, the mounting surface may include a plurality of protrusions, a plated surface, and/or a mask that reduces the conductivity of the connector pad which reduces signal integrity issues due to resonance.

15 Claims, 19 Drawing Sheets

CIRCUIT BOARD PAD RESONANCE CONTROL SYSTEM

BACKGROUND

The present disclosure relates generally to information handling systems, and more particularly to reducing resonance that would otherwise be introduced via the coupling of connector elements to circuit board pads in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically include circuit boards with connector pads that are utilized to mount connectors to the circuit board, and those connectors are then used to connect subsystems utilized with the information handling system via the circuit board. Furthermore, as data transmission speeds in information handling systems increase, connectors such as Surface Mount Technology (SMT) connectors tend to be the connectors of choice for relatively high speed signal applications due to their signal integrity benefits resulting from, for example, their enablement of back-drilling, shielding of ground vias, choice of desired signals, and ground via assignments. However, other relatively high speed signal applications may utilize cables directly soldered to the connector pads on the circuit board in order, for example, to avoid paddle board and/or other connection impairments. Conventionally, the orientation of the connectors and cables when mounted to the connector pads has been unimportant.

However, the inventors of the present disclosure have discovered that subtle parasitic effects can be introduced at relatively high data transmission speeds in response to particular connector and cable mounting orientations. For example, depending on how the signal transmission line connects to the connector pad, the orientation of the connector or cable in connecting to the connector pad can result in the connector pad and/or a portion of the lead frame/cable providing a signal transmission path that is "dangling", "unused", or otherwise "open", and that may act as a resonator (e.g., at quarter wavelengths) that can compromise the signal integrity of the communication channel.

Accordingly, it would be desirable to provide a circuit board pad resonance control system.

SUMMARY

According to one embodiment, an Information Handling System (IHS) includes a circuit board; a processing system mounted to the circuit board; a memory system mounted to the circuit board and coupled to the processing system through the circuit board; a signal transmission line included on the circuit board and coupled to the processing system; and a plurality of connector pads that are positioned on the board and that include: a first connector pad that receives the signal transmission line adjacent a first end of the first connector pad, wherein the first connector pad includes a mounting surface that is configured to: mount directly to a coupling element that is configured to couple a subsystem to the board; and reduce a resonance that is produced by an open portion of a signal transmission path that is created when the coupling element is directly mounted to the mounting surface of the first connector pad in a first orientation.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
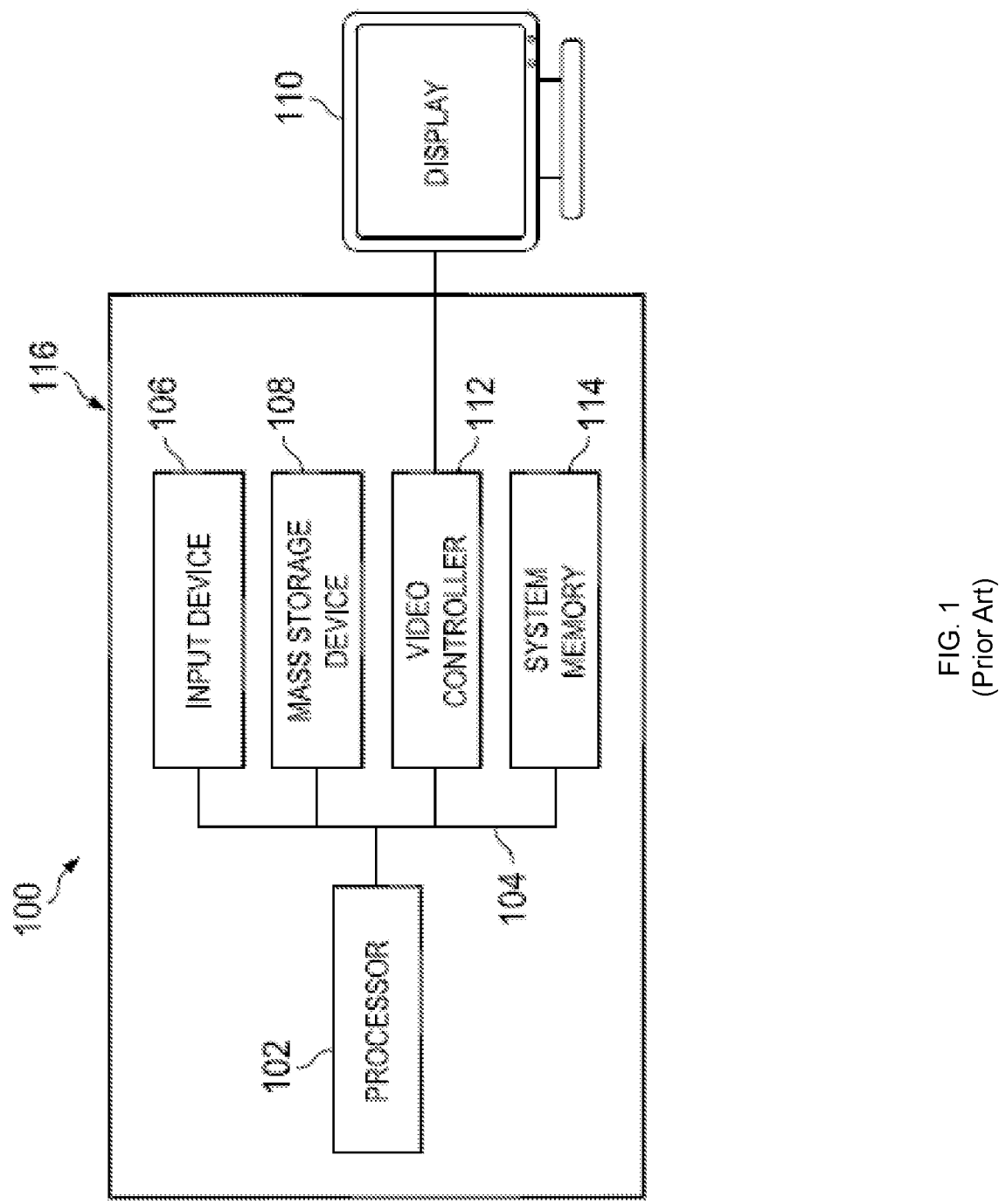
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
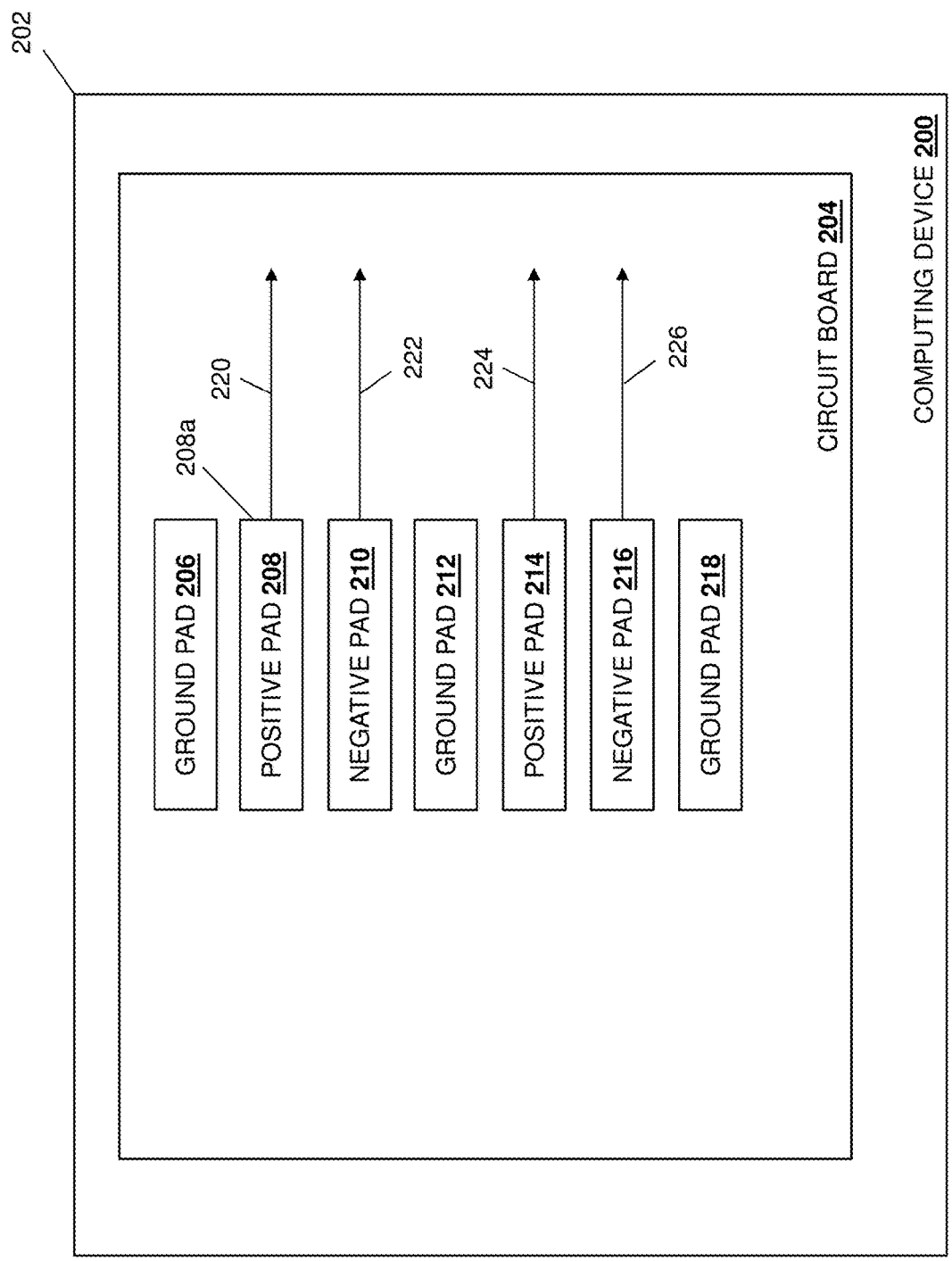
FIG. 2A is a schematic top view illustrating an embodiment of a computing device including a circuit board having conventional connector pads.

Referring now to FIG. 2A, an embodiment of a conventional computing device 200 is illustrated that may be the IHS 100 discussed above with reference to FIG. 1, and/or may include some or all of the components of the IHS 100. In the illustrated embodiment, the computing device 200 includes a chassis 202 that houses the components of the computing device 200, only some of which are illustrated in FIG. 2A. In the embodiment of FIG. 2A, the chassis 202 is illustrated as housing a circuit board 204 including a plurality of conventional connector pads such as, for example, the ground pad 206, the positive pad 208, the negative pad 210, the ground pad 212, the positive pad 214, the negative pad 216, and the ground pad 218 illustrated in FIG. 2A. The circuit board 204 includes a plurality of signal transmission lines including the signal transmission line 220 extending from positive pad 208, the signal transmission line 222 extending from negative pad 210, the signal transmission line 224 extending from positive pad 214, and the signal transmission line 226 extending from negative pad 216, as illustrated in FIG. 2A.

Figure 2B:
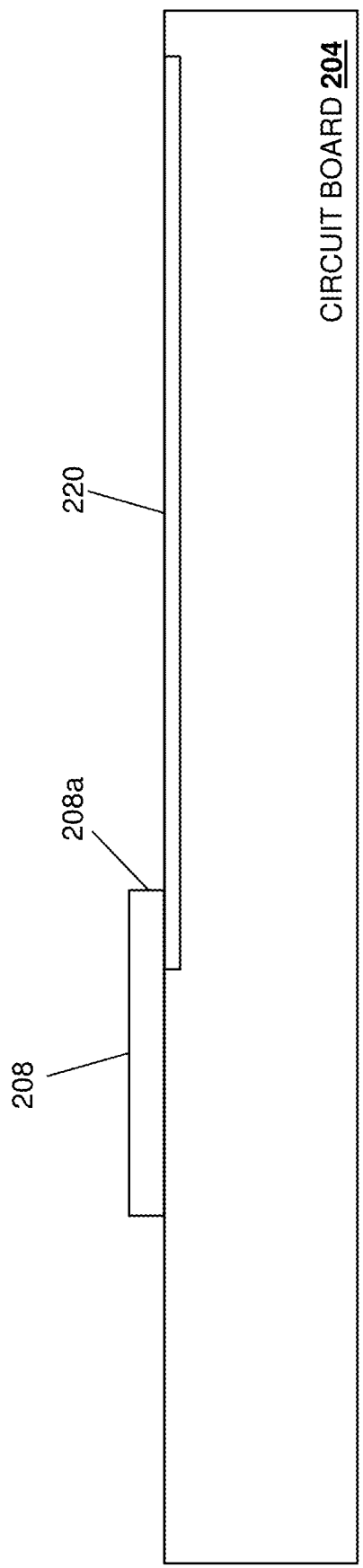
FIG. 2B is a schematic cross-sectional view illustrating an embodiment of a conventional connector pad of FIG. 2A.

With reference to FIG. 2B, the positive pad 208 and signal transmission line 220 included on the circuit board 204 of FIG. 2A are illustrated in more detail. However, one of skill in the art in possession of the present disclosure will recognize that the pad and signal transmission line illustrated in FIG. 2B may be any of the negative pad 210/signal transmission line 222, the positive pad 214/signal transmission line 224, and/or the negative pad 216/signal transmission line 226 as well. As can be seen in FIG. 2B, the signal transmission line 220 extends through the circuit board 204, and is received by the positive pad 208 adjacent an end 208a of the positive pad 208. As discussed above, connectors, cables, and/or other coupling members may be mounted to the connector pads on the circuit board 204 in order to couple those coupling members to the signal transmission lines, and subsequently enable devices, components, and/or other computing device subsystems to be connected to those coupling members in order to provide for communication with other devices, components, and/or computing systems that are connected to the circuit board (e.g., via the signal transmission lines.)

Figure 2C:
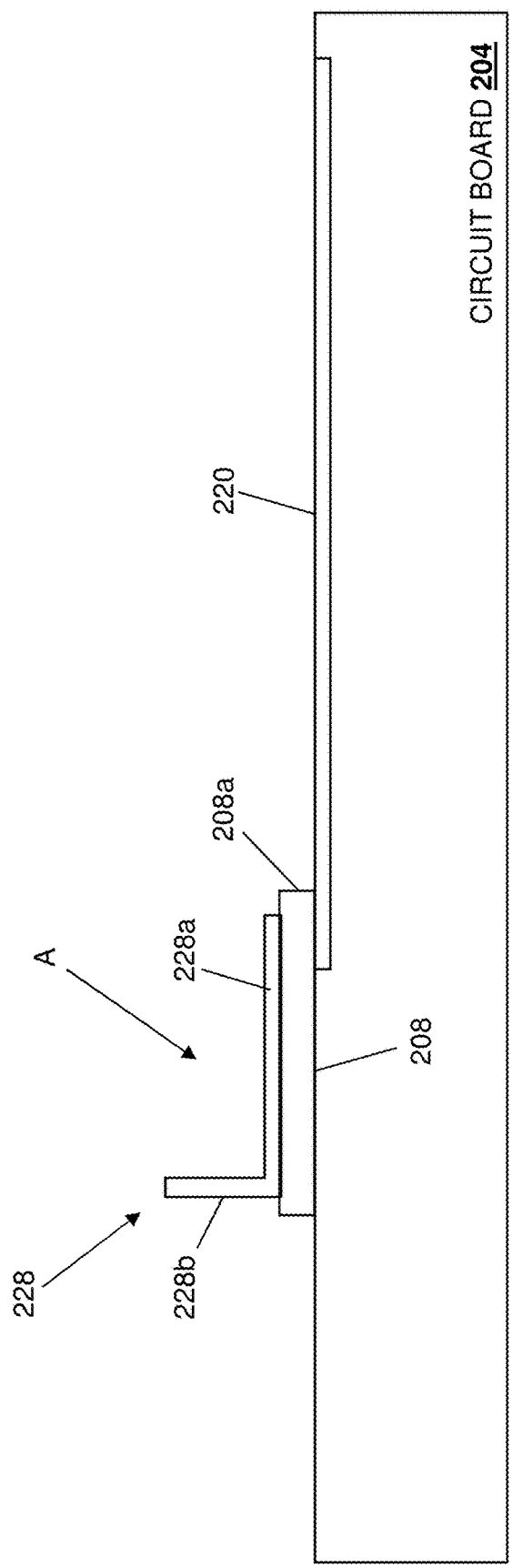
FIG. 2C is a schematic cross-sectional view illustrating an embodiment of a connector connected to the conventional connector pad of FIG. 2B in a first orientation.

For example, FIG. 2C illustrates how a connector may be mounted to the positive pad 208 in a first mounting orientation A. In the illustrated embodiment, a connector lead frame 228 that may be included on, for example, an SMT connector, includes a mounting portion 228a that engages the positive pad 208, and a lead portion 228b that extend substantially perpendicularly from the mounting portion 228a. One of skill in the art will recognize that an SMT connector may include a variety of other SMT components connected to the connector lead frame 228, but those SMT components have been omitted for clarity. As can be seen, in the first mounting orientation A, the mounting portion 228a of the connector lead frame 228 is mounted to the positive pad 208 such that lead portion 228b is located opposite the positive pad 208 from the end 208a of the positive pad 208 that receives the signal transmission line 220.

Figure 2D:
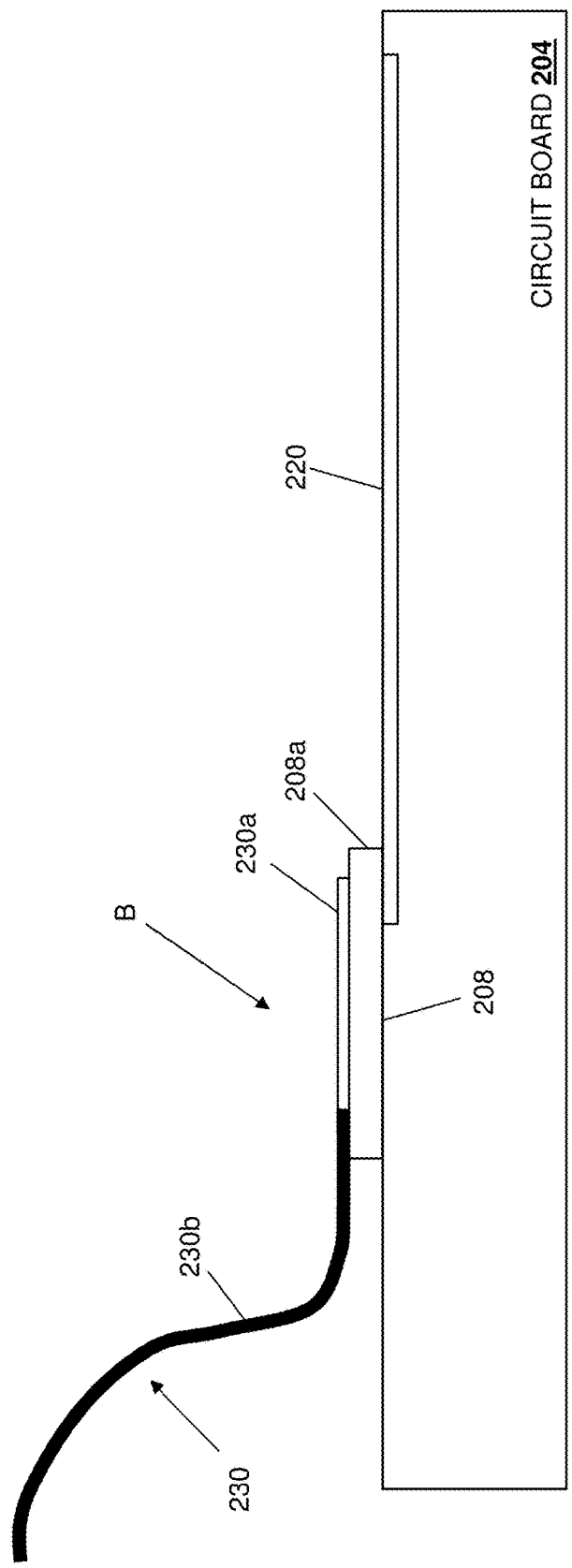
FIG. 2D is a schematic cross-sectional view illustrating an embodiment of a cable connected to the conventional connector pad of FIG. 2B in a first orientation.

Referring now to FIG. 2D, an example is illustrated of how a cable may be mounted to the positive pad 208 in a first mounting orientation B. In the illustrated embodiment, an exposed cable end 230a of the cable 230 engages the positive pad 208, and a shielded cable portion 230b of the cable 230 extends from the exposed cable end 230a. One of skill in the art will recognize that the cable 230 may be connected to a variety of components, but those components have been omitted for clarity. As can be seen, in the first mounting orientation B, the exposed cable end 230a of the cable 230 is mounted to the positive pad 208 such that shielded cable portion 230b extends from the positive pad 208 opposite the end 208a of the positive pad 208 that receives the signal transmission line 220.

Figure 2E:
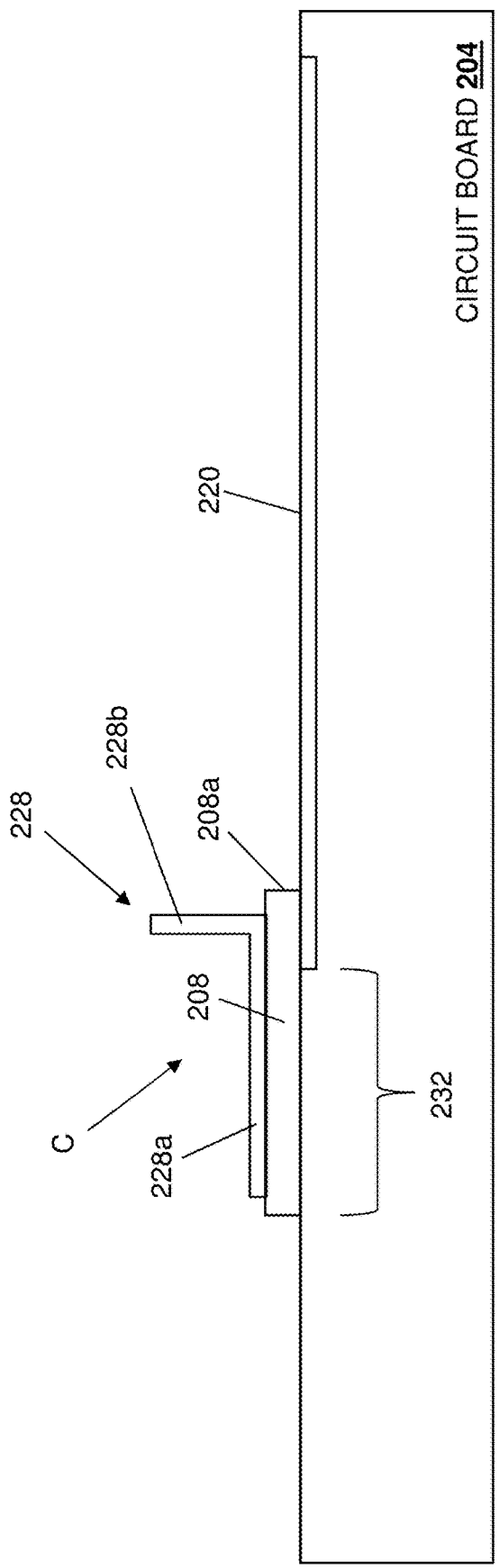
FIG. 2E is a schematic cross-sectional view illustrating an embodiment of a connector connected to the conventional connector pad of FIG. 2B in a second orientation.
Figure 2F:
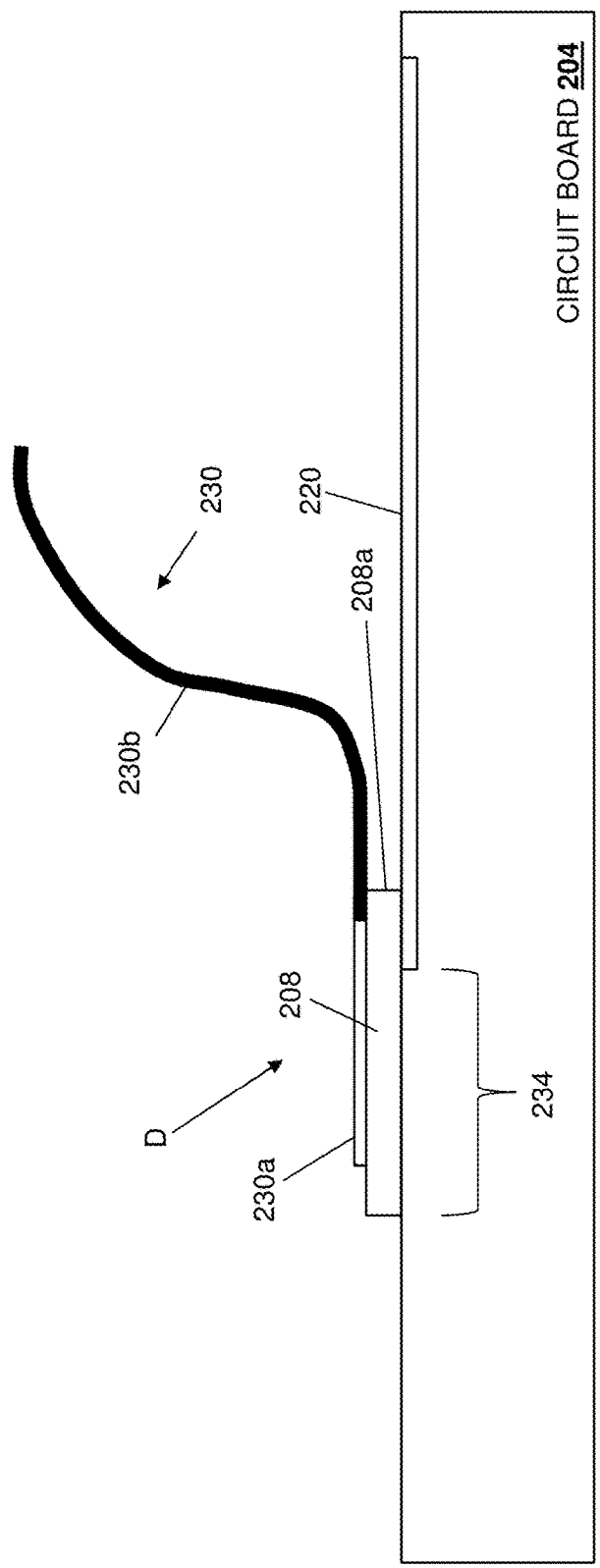
FIG. 2F is a schematic cross-sectional view illustrating an embodiment of a cable connected to the conventional connector pad of FIG. 2B in a second orientation.

Referring now to FIG. 2E, an example is illustrated of how a connector may be mounted to the positive pad 208 in a second mounting orientation C. As in the embodiment discussed above with reference to FIG. 2C, the connector lead frame 228 includes the mounting portion 228a that engages the positive pad 208, and the lead portion 228b that extend substantially perpendicularly from the mounting portion 228a. However, in the second mounting orientation C, the mounting portion 228a of the connector lead frame 228 is mounted to the positive pad 208 such that lead portion 228b is located adjacent the end 208a of the positive pad 208 that receives the signal transmission line 220. Referring now to FIG. 2F, an example is illustrated of how a cable may be mounted to the positive pad 208 in a second mounting orientation D. As in the embodiment discussed above with reference to FIG. 2D, the exposed cable end 230a of the cable 230 engages the positive pad 208, and the shielded cable portion 230b of the cable 230 extends from the exposed cable end 230a. However, in the second mounting orientation D, the exposed cable end 230a of the cable 230 is mounted to the positive pad 208 such that shielded cable portion 230b extends adjacent the end 208a of the positive pad 208 that receives the signal transmission line 220.

Figure 3A:
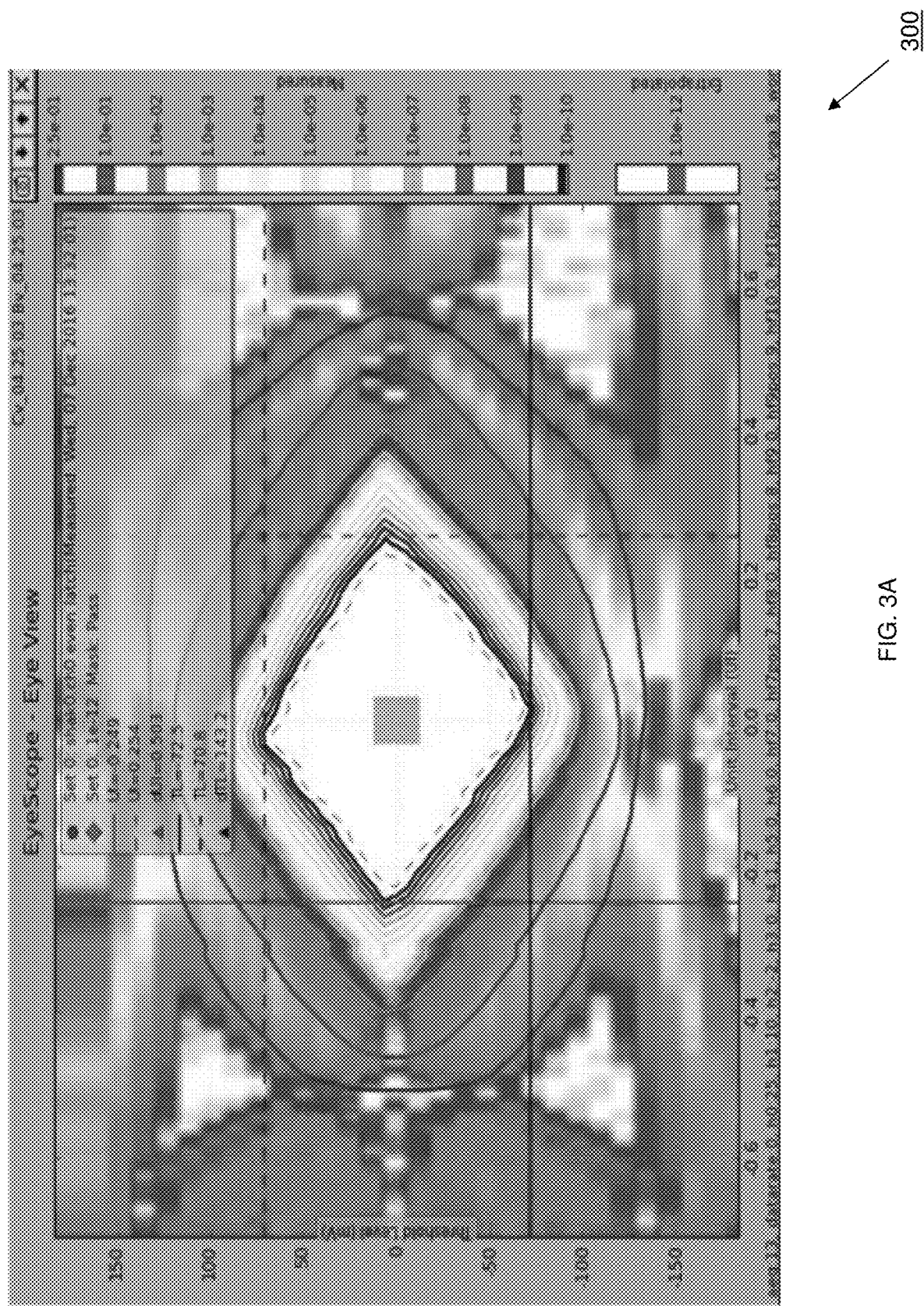
FIG. 3A is a chart illustrating an eye diagram for signals transmitted via the connector mounted to the connector pad in the first orientation of FIG. 2C.
Figure 3B:
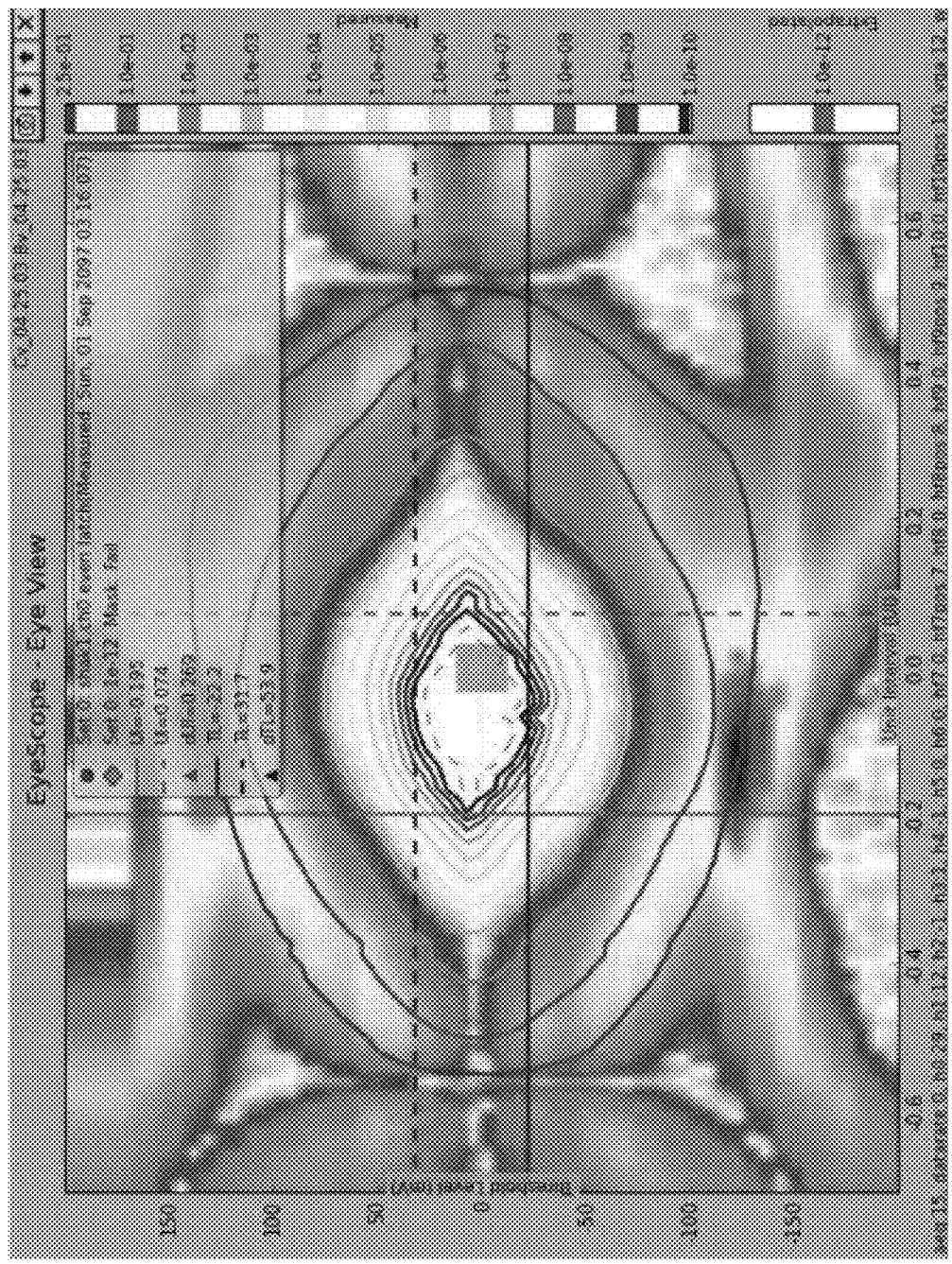
FIG. 3B is a chart illustrating an eye diagram for signals transmitted via the connector mounted to the connector pad in the second orientation of FIG. 2E.

Referring now to FIGS. 3A and 3B, eye diagrams are provided of signals transmitted using the connector/connector pad in the different mounting orientations illustrated in FIGS. 2C and 2E. Specifically, FIG. 3A illustrates an eye diagram 300 of signals provided via the connector lead frame 228 and positive pad 208 mounted in the first mounting orientation A of FIG. 2C, while FIG. 3B illustrates an eye diagram 302 of signals provided via the connector lead frame 228 and positive pad 208 mounted in the second mounting orientation C of FIG. 2E. One of skill in the art in possession of the present disclosure will appreciate that the eye diagram 300 is representative of a signal with superior characteristics relative to the signal represented by the eye diagram 302, and it has been found that the second mounting orientation C of the connector lead frame 228 to the positive pad 208 is responsible for those degraded signal characteristics. For example, with reference to FIG. 2E, it can be seen that the second mounting orientation C of the connector lead frame 228 to the positive pad 208 provides a portion of the positive pad 208 and the mounting portion 228a of the connector lead frame 228 that extend away from the end 208a of the positive pad 208, and which provide an open portion 232 of the transmission path that can resonate at high signal transmission speeds. In other words, high speed signals may be transmitted through the signal transmission line 220 to the positive pad 208, primarily through the portion of the positive pad 208 adjacent its end 208a, and then primarily through the lead portion 228b of the connector lead frame 228. As such, the high speed signals may primarily bypass the open portion 232 of the transmission path that includes the remaining portion of the positive pad 208 and the mounting portion 228a of the connector lead frame 228, and that open portion 232 of the transmission path has been found to produce resonance that degrades high speed signals, as illustrated in the eye diagram 302.

Figure 4:
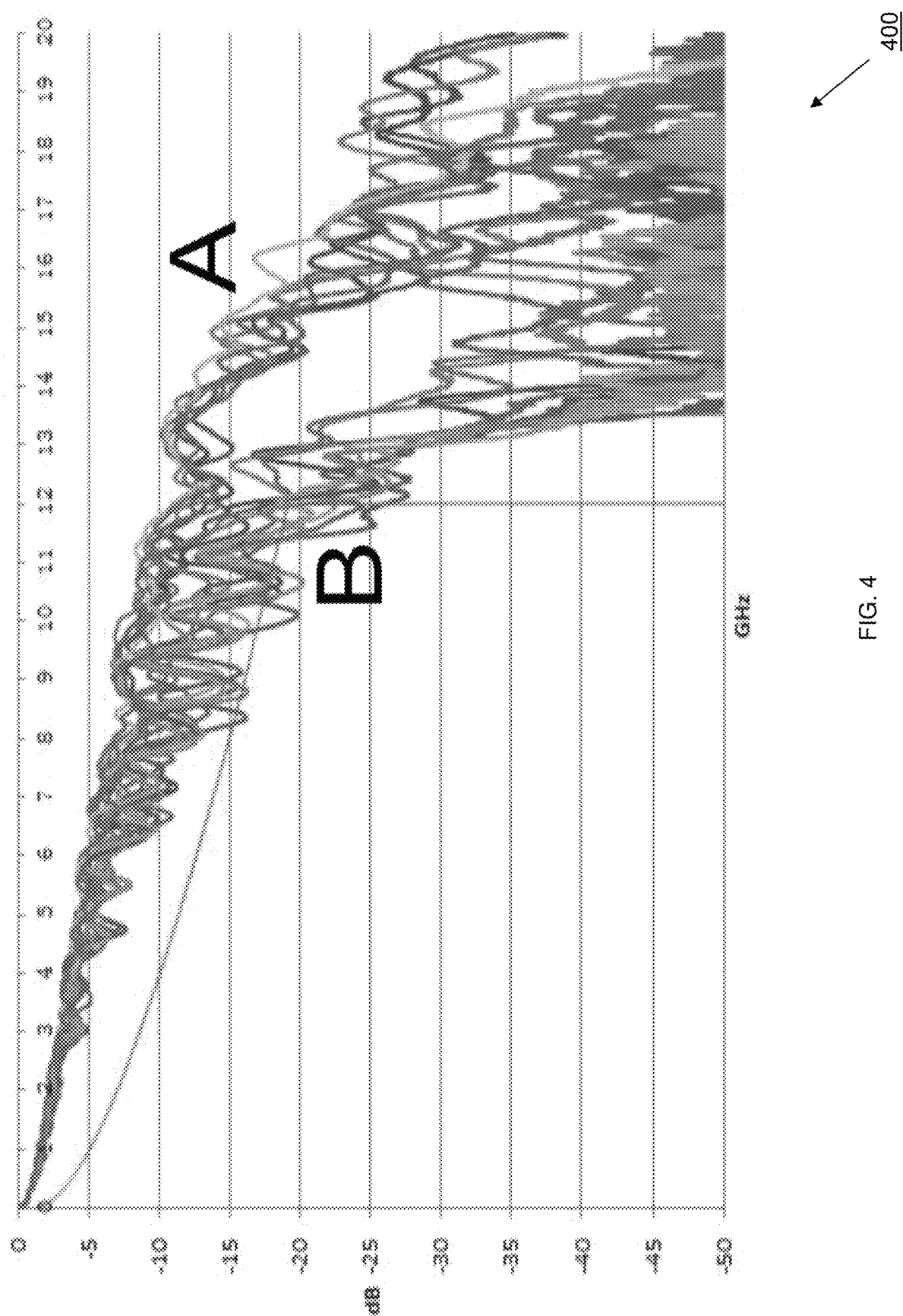
FIG. 4 is a chart illustrating insertion losses associated with the cable mounted to the connector pad in the first orientation of FIG. 2D, and the cable mounted to the connector pad in the second orientation of FIG. 2F.

Referring now to FIG. 4, a chart 400 of insertion losses is provided for signals transmitted using the cable/connector pad in the different mounting orientations illustrated in FIGS. 2D and 2F. Specifically, the insertion loss chart of FIG. 4 illustrates insertion losses for cables (marked as "A" in the chart) similar to the cable 230 when mounted to the positive pad 208 the first mounting orientation B of FIG. 2D, as well as insertion losses for cables (marked as "B" in the chart) similar to the cable 230 when mounted to the positive pad 208 the second mounting orientation D of FIG. 2F. In the experimental embodiment that produced the chart 400, the cable insertion losses marked as "A" were low enough to satisfy a signal specification, while the cable insertion losses marked as "B" violated that signal specification, and it has been found that the second mounting orientation D of the exposed cable end 230a of the cable 230 to the positive pad 208 is responsible for those degraded signal characteristics. For example, with reference to FIG. 2F, it can be seen that the second mounting orientation D of the exposed cable end 230a to the positive pad 208 provides a portion of the positive pad 208 and the exposed cable end 230a of the cable 230 that extend away from the end 208a of the positive pad 208, and provide an open portion 234 of the transmission path that can resonate at high signal transmission speeds. In other words, high speed signals may be transmitted through the signal transmission line 220 to the positive pad 208, and then primarily through the portion of the exposed cable end 230a of the cable 230 adjacent the end 208a. As such, the high speed signals may primarily bypass the open portion 234 of the transmission path that includes the remaining portion of the positive pad 208 and the remaining portion of the exposed cable end 230a of the cable 230, and that open portion 234 of the transmission path has been found to produce resonance that degrades high speed signals, as illustrated in by the insertion losses of the cables marked "B" in the chart 400.

Figure 5A:
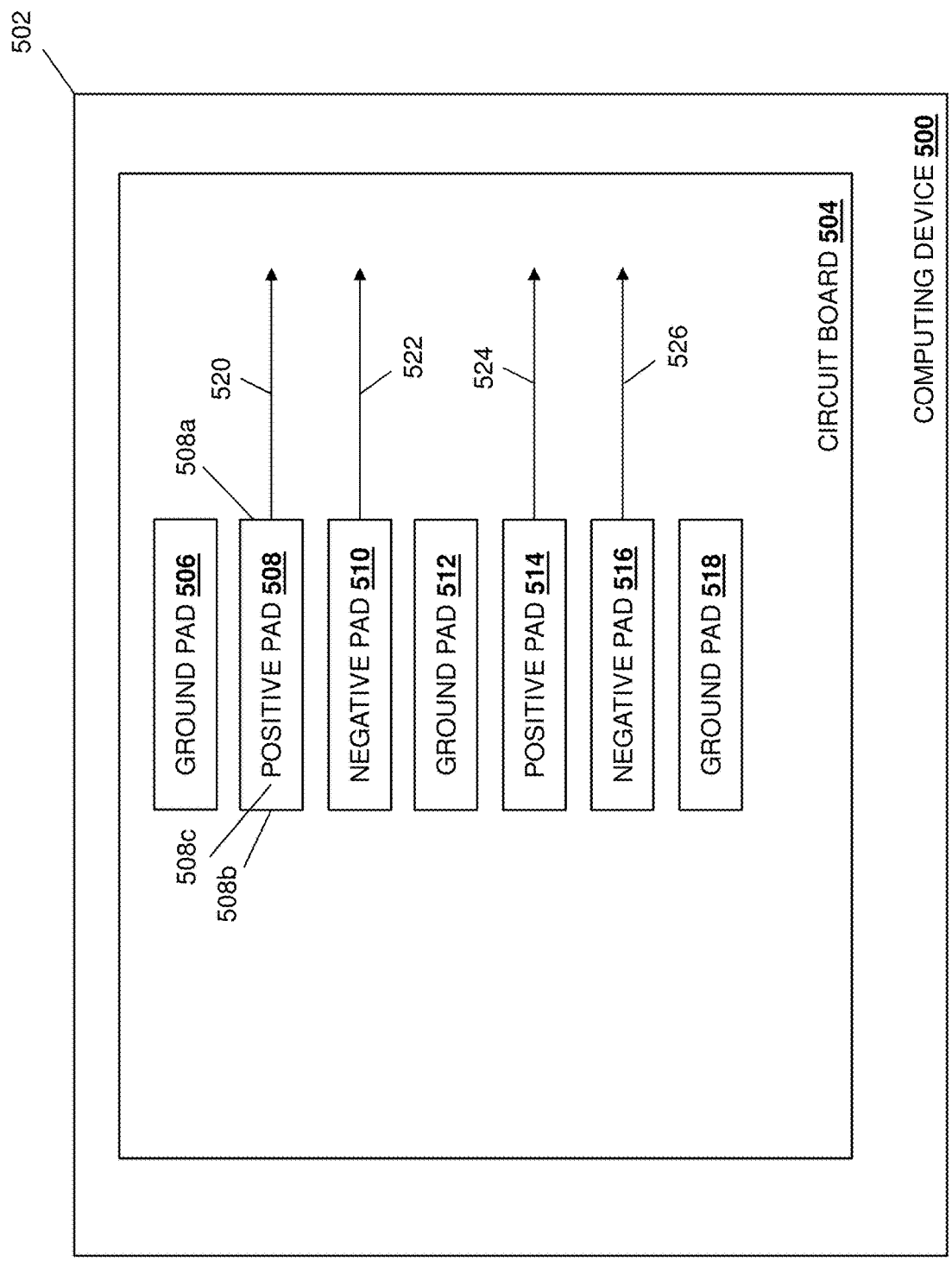
FIG. 5A is a schematic top view illustrating an embodiment of a computing device including a circuit board having connector pads according to the teachings of the present disclosure.

Referring now to FIG. 5A, an embodiment of a computing device 500 of the present disclosure is illustrated that may be the IHS 100 discussed above with reference to FIG. 1, and/or may include some or all of the components of the IHS 100. For example, the computing device 500 may include a server computing device, a storage computing device, a networking computing device, a laptop/notebook computing device, a desktop computing device, a tablet computing device, a mobile computing device, and/or a variety of other computing devices that would be apparent to one of skill in the art in possession of the present disclosure. In the illustrated embodiment, the computing device 500 includes a chassis 502 that houses the components of the computing device 500, only some of which are illustrated in FIG. 5A. In the embodiment of FIG. 5A, the chassis 502 is illustrated as housing a circuit board 504 including a plurality of connector pads that are provided according to the teaching of the present disclosure. For example, in the illustrated embodiment those connector pads include a ground pad 506, a positive pad 508, a negative pad 510, a ground pad 512, a positive pad 514, a negative pad 516, and a ground pad 518 as illustrated in FIG. 5A. The circuit board 504 includes a plurality of signal transmission lines including a signal transmission line 520 extending from the positive pad 508, a signal transmission line 522 extending from the negative pad 510, a signal transmission line 524 extending from the positive pad 514, and a signal transmission line 526 extending from the negative pad 516, as illustrated in FIG. 5A.

Figure 5B:
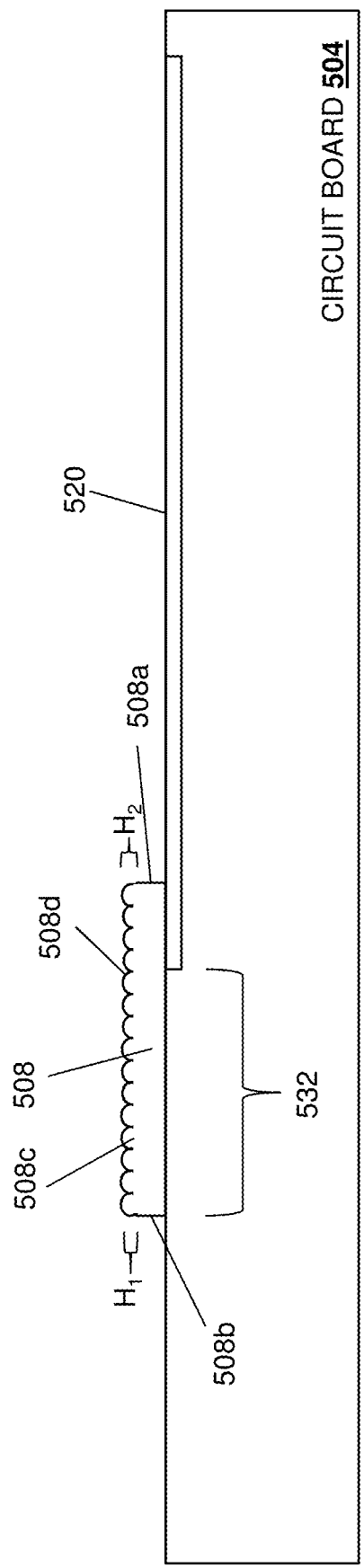
FIG. 5B is a schematic cross-sectional view illustrating an embodiment of a connector pad of FIG. 5A.

With reference to FIGS. 5A and 5B, the positive pad 508 and the signal transmission line 520 included on the circuit board 504 are illustrated in more detail. However, one of skill in the art in possession of the present disclosure will recognize that the pad and signal transmission line illustrated in FIG. 5B may be any of the negative pad 510/signal transmission line 522, the positive pad 514/signal transmission line 524, and/or the negative pad 516/signal transmission line 526 as well. Likewise, one of skill in the art in possession of the present disclosure will recognize that the pad illustrated in FIG. 5B may be any of the ground pads 506, 512, and/or 518. The ground pads 512 and/or 518 may act a current return path for signals and therefore resonance at the ground pads may impact the loss on signals of the system. As can be seen in FIG. 5B, the signal transmission line 520 extends through the circuit board 504, and is received by the positive pad 508 adjacent an end 508a of the positive pad 508. Furthermore, the positive pad 508 also includes an end 508b that is located opposite the positive pad 508 from the end 508a that receives the signal transmission line 520. While the positive pad 508 and the signal transmission line 520 are illustrated as included on an outer surface of the circuit board 504, the connector pads and/or signal transmission lines may be provided on one or more internal layers of the circuit board while remaining within the scope of the present disclosure as well.

In addition, the positive pad 508 may include a mounting surface 508c that is located between the ends 508a and 508b of the positive pad 508 and that, in the illustrated embodiment, is located opposite the positive pad 508 from the circuit board 504. As discussed in further detail below, the mounting surface 508c is configured to mount directly to a coupling element that is further configured to electrically couple a subsystem of the computing device 500 to the circuit board 504. As also discussed in further detail below, the mounting surface 508c is configured to reduce a resonance that would otherwise be produced by an open portion 532 of a signal transmission path that is created when the coupling element is directly mounted to the mounting surface 508c of the positive pad 508 in the orientations C and D, respectively, discussed above with reference to FIGS. 2E and 2F.

In various examples, the mounting surface 508c is a modified or manufactured surface that provides a "lossy" surface that is configured to lower a conductivity of the positive pad 508, which operates to reduce a current flow within the positive pad 508 when a signal is transmitted via the positive pad 508. For example, the mounting surface 508c may have a relatively lower conductivity as compared to a positive pad of similar dimensions that does not include the mounting surface 508c such as, for example, a mounting surface of the conventional positive pad 208 which may be configured with a low-loss or substantially lossless surface. As would be understood by one of skill in the art, the conventional positive pad 208 may be provided with such low-loss or substantially lossless surfaces to reduce the overall insertion loss and/or return loss of a signal transmission path through which signals may be transmitted (e.g., via the signal transmission line 220 from a transmitter/receiver component of the computing device 500, through the positive pad 208 via the portion of the positive pad 208 adjacent its end 208a, and primarily via the lead portion 228b of the connector lead frame 228 to a receiver/transmitter component of the computing device 500, as discussed above with reference to FIG. 2E.)

Common transmission paths may include lengths of 10 inches, 15 inches, 20 inches, and 25 inches, although other signal transmission lengths that would be apparent to one of skill in the art in possession of the present disclosure will fall within the scope of the present disclosure as well. In a specific example, the positive pad 508 may be 40 mils to 110 mils in length, 10 to 30 mils in width, and thus less than 1% of the total length of the transmission path, although other connector pad lengths will fall within the scope of the present disclosure as well. It has been discovered by the inventors of the present disclosure that the mounting surface 508c may be provided with increased loss characteristics that do not substantially increase insertion losses and return losses in signal transmission paths with little resonance (such as those with connector elements provided in the orientation A and the orientation B discussed with regard to FIGS. 2C and 2D above) (e.g., a linear increase of less than 1%), while providing those increased loss characteristics via the mounting surface 508c operates to substantially reduce the insertion losses and return losses in signal transmission paths that would otherwise have greater resonance (such as those with connector elements provided in the orientation C and the orientation D discussed with regard to FIGS. 2E and 2F above) due to the relatively small percentage of total length of the signal transmission path that is due to the connector pad, and as illustrated and discussed with regard to the experimental results of FIG. 12. It has been found that the reduction in current flow as a result of the mounting surface 508c operates to reduce the resonance introduced by the open portion 232 of the signal transmission path that is provided when the connector element is coupled to the connector pad in the orientations C and D discussed with regard to FIGS. 2E and 2F above. Furthermore, the loss attributed to roughening the pads can be compensated for at a receiver of the signal using a gain circuit which cannot compensate loss due to resonance.

In some embodiments, the mounting surface 508c is configured with increased loss characteristics via a "roughening" of the mounting surface 508c that provides a plurality of protrusions 508d that vary the surface height of the mounting surface 508c from a minimum height $H_1$ to a maximum height $H_2$. For example, the difference between $H_1$ and $H_2$ may be 20 μm to 50 μm, although other variations in height that would be apparent to one skill in the art in possession of the present disclosure will fall within the scope of the present disclosure. In specific examples, the mounting surface 508c of the positive pad 508 may be roughened by scratching, etching, abrading, and/or otherwise modifying the positive pad 508 to provide channels, grooves, and/or other indentations in the positive pad 508 that create the differing height protrusions 508d that provide the mounting surface 508c. However, in other embodiments, the positive pad 508 may be manufactured with the mounting surface 508c (e.g., the positive pad 508 may not be subject to a polishing process that is conventionally performed to smooth the surface of the positive pad 508) while remaining within the scope of the present disclosure.

In various examples, the positive pad 508 includes a conductive material such as copper. As would be understood by one of skill in the art in possession of the present disclosure, the conventional positive pad 208 may be provided by a rolled annealed (RA) copper foil that is produced from an ingot of solid copper by passing the ingot through a rolling mill, which creates a relatively a smooth profile on the surface of the positive pad 208. For example, RA copper foil may have a root mean square roughness profile ($R_{rms}$) of 0.1 μm to 0.5 μm. To increase the roughness of connector pads for use in the systems of the present disclosure, the positive pad 508 may be formed out of an electrodeposited (ED) copper foil that is produced by plating from a copper sulfate solution. Such electrodeposited (ED) copper foils may have an $R_{rms}$ of 0.7 µm to 11 µm. However, copper foils with higher $R_{rms}$ values may be utilized in the systems of the present disclosure, for as the $R_{rms}$ value increases, the insertion loss associated with the use of that positive pad 508 increases as well. While the positive pad 508 is described as being composed of copper, one of skill in the art in possession of the present disclosure may recognize that other conductive materials may be utilized for the mounting surface 508c to reduce current flow through the positive pad 508.

Figure 6:
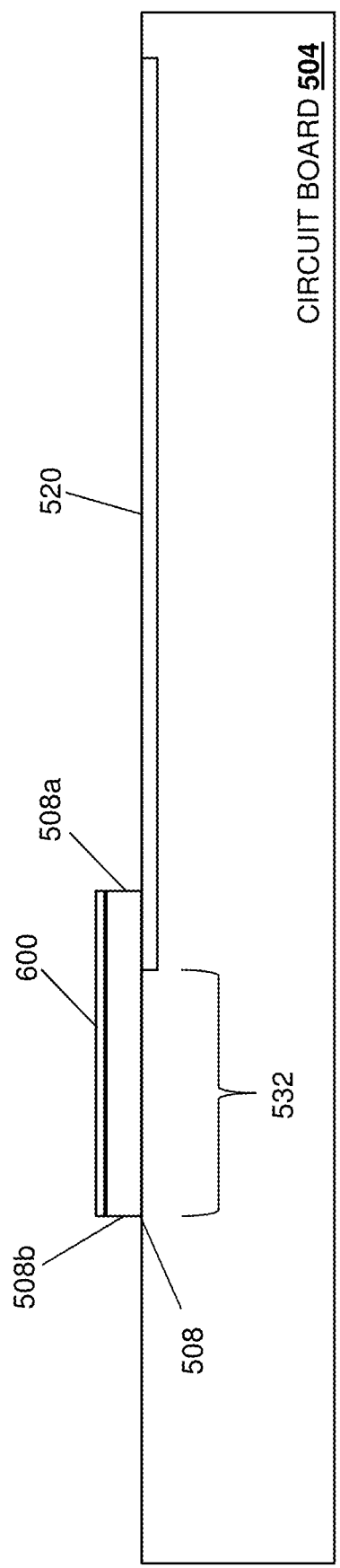
FIG. 6 is a schematic cross-sectional view illustrating an embodiment of a connector pad according to the teachings of the present disclosure.

Referring now to FIG. 6, an embodiment of the computing device 500 is illustrated that includes the circuit board 504 with the ground pad 506, the positive pad 508, the negative pad 510, the ground pad 512, the positive pad 514, the negative pad 516, and the ground pad 518 discussed in FIG. 5A, but with the addition of a modified mounting surface (e.g., modified from the mounting surface 508c discussed above with reference to FIGS. 5A and 5B). For example, in the illustrated embodiment, the positive pad 508 includes a plated mounting surface 600 that extends between the end 508a and the end 508b of the positive pad 508. While the plated mounting surface 600 is illustrated as extending along the entire length of the positive pad 508 between the end 508a and the end 508b, one of skill in the art in possession of the present disclosure will recognize that the plated mounting surface 600 may cover any portion of the positive pad 508. For example, the plated mounting surface 600 may cover the open portion 532 of a signal transmission path that is similar to the open portions 232 and 234 of the signal transmission paths discussed above with reference to FIGS. 2E and 2F. In various embodiments, the plated mounting surface 600 may be provided using a different material than that used for the positive pad 508. For example, the positive pad 508 may be provided by copper materials, while the plated mounting surface 600 may be provided by an electroless nickel immersion gold (ENIG) that is 1-10 µm thick. However, the plated mounting surface 600 may be provided other materials and/or materials having other thicknesses or characteristics that one of skill in the art in possession of the present disclosure would recognize would provide a decreased conductivity associated with the reduced resonance taught by the present disclosure when signals are transmitted via connectors mounted to the plated mounting surface 600 in a first orientation, while not substantially degrading signals transmitted via connectors mounted to the plated mounting surface 600 in a second orientation.

Figure 7:
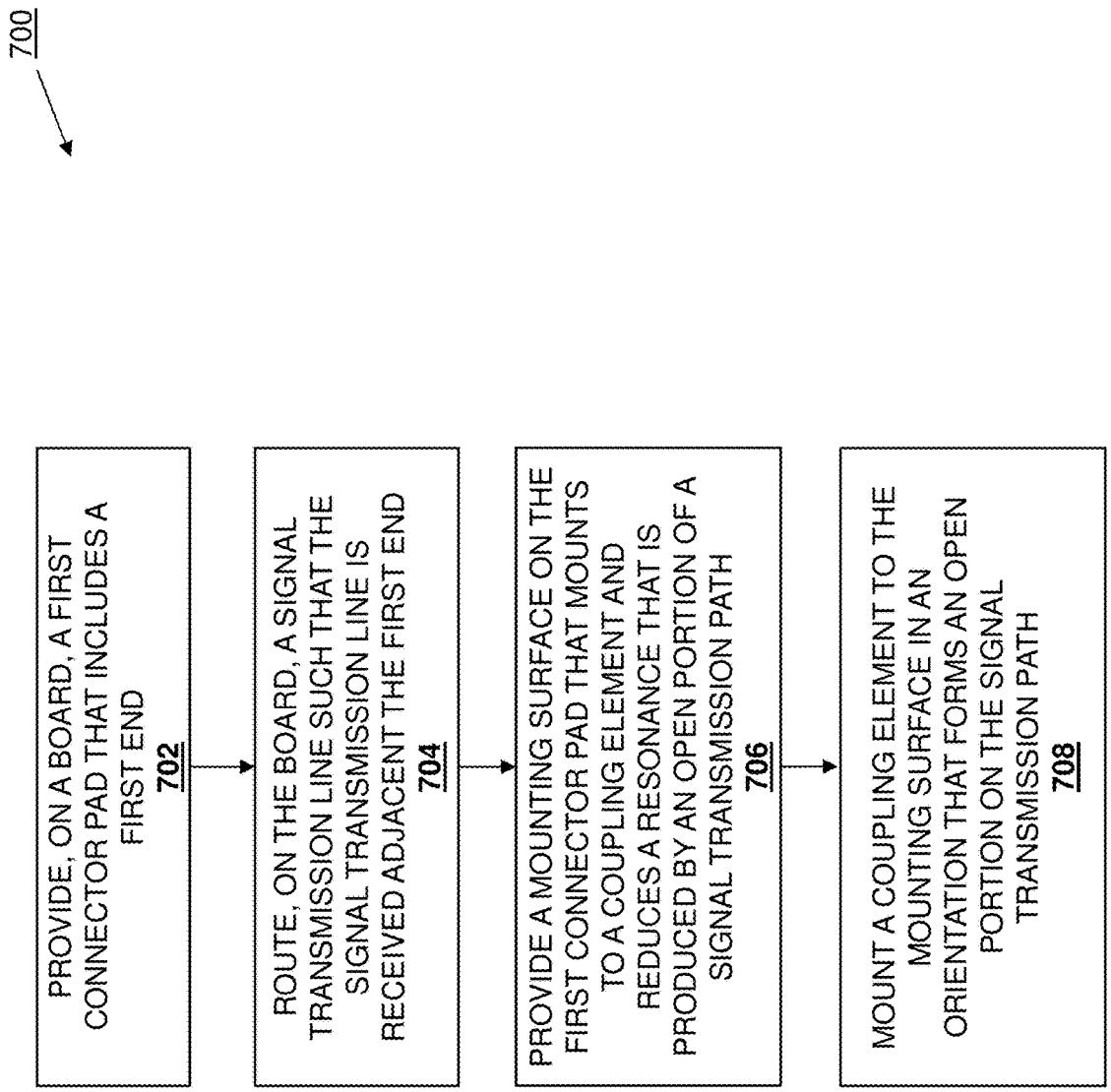
FIG. 7 is a flow chart illustrating an embodiment of a method for controlling resonance in circuit board connector pads.

Referring now to FIG. 7, an embodiment of method 700 for controlling resonance on a circuit board connector pad is illustrated. In some embodiments, the systems and methods of the present disclosure provide for the reduction of conductivity of a circuit board connector pad to reduce the resonance produced by an open portion of a signal transmission path that is created when a coupling element is directly mounted to the circuit board connector pad in an orientation that forms that open portion of the signal transmission path. As would be understood by one of skill in the art in possession of the present disclosure, connector pad dimensions on a circuit board are typically larger than the pin, lead frame, or exposed cable end being mounted thereto in order to provide for assembly tolerances and/or SMT component wetting areas, in consideration of manufacturing and/or alignment variations, and/or in consideration of other mounting element/connector pad issues in order to help ensure that the mounting element may be properly mounted to the connector pad (e.g., within the connector pad footprint to ensure a "good" connection.) As illustrated and discussed above, conventional connector pads are provided as symmetrical rectangles, and that symmetrical shape may result in the mounting of connectors and/or exposed cable ends to those connectors pads in either of two orientations, one of which introduces an open portion in the transmission path that can resonate and reduce the quality of high speed signals that are transmitted via that connection.

The connector pads of the present disclosure include a mounting surface that is configured to reduce resonance of an open portion of the signal transmission path that is provided when a coupling element is directly mounted to the mounting surface of the connector pad in an orientation that forms the open portion. The mounting surface may be provided with increased loss characteristics that reduce the conductivity of the connector pad relative to conventional connector pads by "roughening" the surface of the connector pad, plating the mounting surface of the connector pad with a less conductive material, coating the conductor pad with a solder mask, and/or via other techniques that would be apparent to one of skill in the art in possession of the present disclosure. While increasing the loss characteristics of the mounting surface may introduce some signal integrity issues such as, for example, insertion losses and return losses into the signal transmission path, it has been discovered by the inventors of the present disclosure that such increases in insertion losses and return losses due to the decreased conductivity is relatively minor, while the reduction in resonance-generated insertion losses and return losses that are provided by the decreased conductivity are relatively substantial. As such, reducing conductivity of the mounting surface of the connector pads has been found to provide for a net reduction in insertion losses and return losses on signal transmission paths by reducing resonance produced in a signal transmission path that includes an open portion. Furthermore, the reduction in conductivity may also reduce cross talk coupling between adjacent connector pads, which allows the connectors pads to be spaced closer together, as well as provide other benefits that would be apparent to one of skill in the art in possession of the present disclosure.

The method 700 begins at block 702 where at least one connector pad is provided on a board with a first end. In an embodiment, at block 702, the circuit board 504 may be provided, and a connector pad having a first end may be provided on that circuit board 504. For example, with reference to FIGS. 5A, 5B, and 6, the positive pad 508 with the end 508a may be provided on the circuit board 504, and any of the negative pad 510, the positive pad 514, and the negative pad 516 may be provided on the circuit board 504 in a similar manner. As discussed above, the end 508a on the positive pad 508 may be located opposite the positive pad 508 from an end 508b.

The method 700 then proceeds to block 704 where a signal transmission line is routed on the board such that it is received adjacent the first end of the connector pad. In an embodiment, at block 704, respective signal transmission lines are routed on the circuit board 504 such that they are received by connector pads on the circuit board 504 adjacent their first ends. For example, with reference to FIGS. 5A, 5B, and 6, the signal transmission line 520 may be routed on the circuit board 504 such that it is received by the positive pad 508 adjacent its end 508a. Furthermore, the signal transmission lines 522, 524, and 526 may be routed through the circuit board 504 such that they are received by the negative pad 510, the positive pad 514, and the negative pad 516, respectively.

The method 700 then proceeds to block 706 where a mounting surface is provided on the connector pad that receives the signal transmission line, with the mounting pad configured to mount directly to a coupling element that is configured to couple a subsystem to the board, and configured to reduce a resonance that is produced by an open portion of a signal transmission path that is created when the coupling element is directly mounted to the mounting surface of the connector pad in a first orientation. In an embodiment, at block 706, the circuit board 504 may be provided with a connector pad having a mounting surface. For example, with reference to FIGS. 5A, 5B, and 6, the positive pad 508 may be provided on the circuit board 504 with the mounting surface 508c that extends between the end 508a and the end 508b, and any of the negative pad 510, the positive pad 514, and the negative pad 516 may be provided on the circuit board 504 with a mounting surface that is similar to the mounting surface 508c discussed above. As such, the mounting surface 508c discussed above may be provided with increased loss characteristics such that the mounting surface 508c is relatively less conductive compared to conventional mounting surfaces provided on conventional connector pads such as the positive pad 208 of FIGS. 2A-2F. As discussed above, the mounting surface 508c may be roughened such that mounting surface 508c includes a plurality of protrusions 508d, or the mounting surface 508c may be provided by providing electrodeposited (ED) copper foil (e.g., a copper foil having an $R_{rms}$ of 0.7 µm to 11 µm as described in the example above.) However, other mounting surface roughening techniques utilizing masking and etching techniques such as photoengraving, PCB milling, silk-screen printing, and/or other techniques that would be apparent to one of skill in the art in possession of the present disclosure will fall within the scope of the present disclosure as well.

In another example, with reference to FIG. 6, the mounting surface may be provided by plating the positive pad 508 with a plated mounting surface 600. As discussed above, the positive pad 508 may be provided by a first material, and may be plated with a second material that is different that the first material and that has a lower conductivity relative to the first material. For example, the positive pad 508 may include a copper material, while the plated mounting surface 600 may include an electroless nickel immersion gold (ENIG) material. In some embodiments, the positive pad 508 may plated with the plated mounting surface 600 by, for example, electroplating, vapor deposition under vacuum, sputter deposition, thin-film deposition, and/or other plating techniques that would be apparent to one or skill in the art in possession of the present disclosure.

Figure 8:
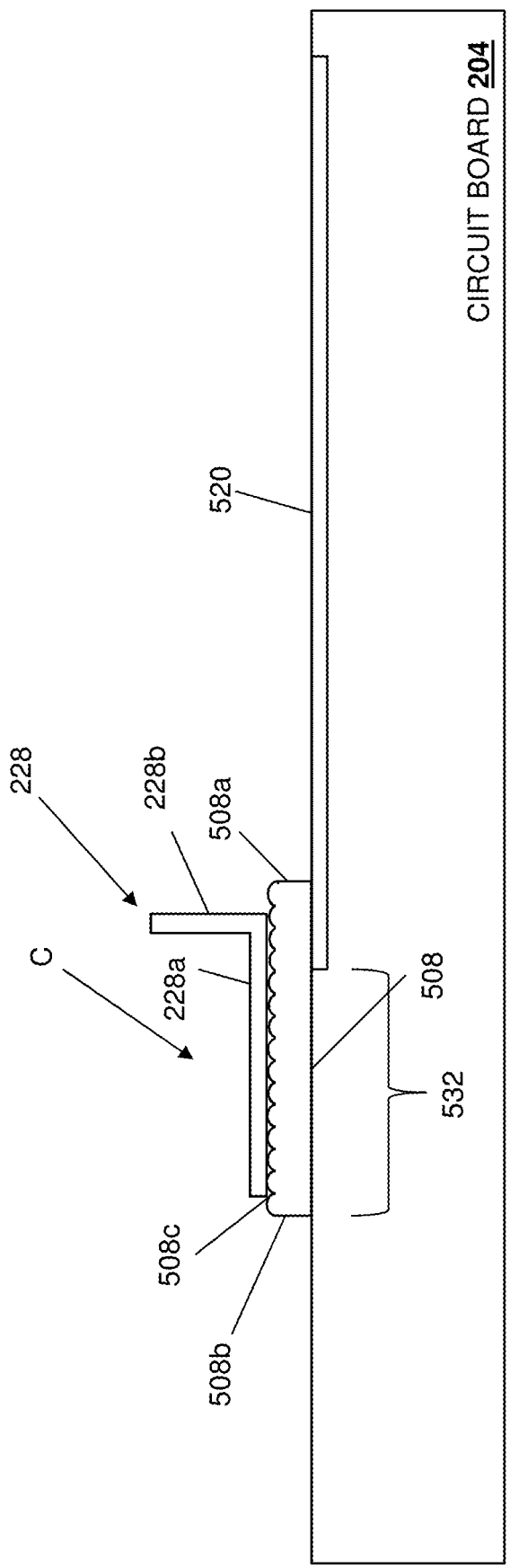
FIG. 8 is a schematic cross-sectional view illustrating an embodiment of a connector mounted in a first orientation to a roughened mounting surface on a connector pad of the present disclosure.

The method 700 then proceeds to block 708 where a coupling element is mounted to the connector pad in the mounting orientation that forms the open portion. With reference to FIG. 8, an embodiment of the connector lead frame 228 mounted to the positive pad 508 in the third orientation C is illustrated, and one of skill in the art in possession of the present disclosure will recognize from the discussion above how a user mounting the connector lead frame 228 to the positive pad 508 may be unaware that the signal transmission line 520 is received by that positive pad 508 adjacent the end 508a, and thus may orient the connector lead frame 228 incorrectly in the third mounting orientation C that results in the open portion 532 of the signal transmission path that can produce a resonance when high speed signals are transmitted along that signal transmission path. However, due to the decrease in conductivity produced in the positive pad 508 by the mounting surface 508c, return losses and insertion losses in high speed signals that would otherwise exist due to resonance by the open portion 532 of the signal transmission path are reduced relative to the return losses and insertion losses produced using a conventional connector pad that has a relatively low-loss or lossless mounting surface. Such high speed signals produce an insertion loss graph 1200 with cable insertion losses similar to those of plot 1204 in FIG. 12 and produce an eye diagram that is an improvement to the eye diagram 302 illustrated in FIG. 3B.

Figure 9:
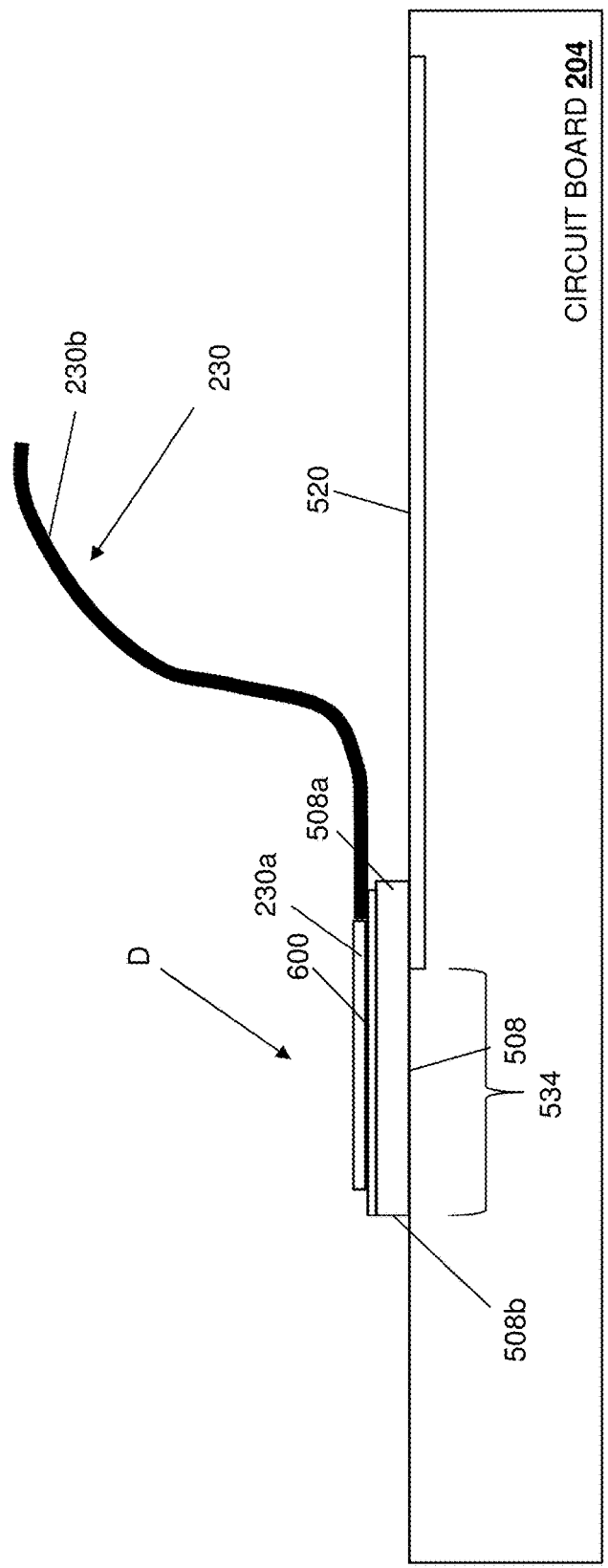
FIG. 9 is a schematic cross-sectional view illustrating an embodiment of a cable mounted in a first orientation to a plated mounting surface on a connector pad of the present disclosure.

With reference to FIG. 9, an embodiment of the cable 230 mounted to the positive pad 508 in the fourth orientation D is illustrated, and one of skill in the art in possession of the present disclosure will recognize from the discussion above how a user mounting the cable 230 to the positive pad 508 may be unaware that the signal transmission line 520 is received by that positive pad 508 adjacent the end 508a, and thus may orient the cable 230 incorrectly in the fourth mounting orientation D that results in the open portion 234 of the signal transmission path that can produce a resonance when high speed signals are transmitted along that signal transmission path. While an exposed cable end 230a of the cable 230 is directly mounted to the plated mounting surface 600, one of skill in the art in possession of the present disclosure will recognize that the connector lead frame 228 may be mounted to the plated mounting surface 600 of FIG. 9, and the cable 230 may be mounted to the mounting surface 508c on the positive pad 508 of FIG. 8. However, due to the decrease in conductivity produced in the positive pad 508 by the plated mounting surface 600, return losses and insertion losses in high speed signals that would otherwise exist due to resonance by the open portion 534 of the signal transmission path are reduced relative to the return losses and insertion losses produced using a conventional connector pad that has a relatively low-loss or lossless mounting surface. Such high speed signals produce an insertion loss graph 1200 with cable insertion losses similar to those of plot 1204 in FIG. 12 and produce an eye diagram that is an improvement to the eye diagram 302 illustrated in FIG. 3B.

Figure 10:
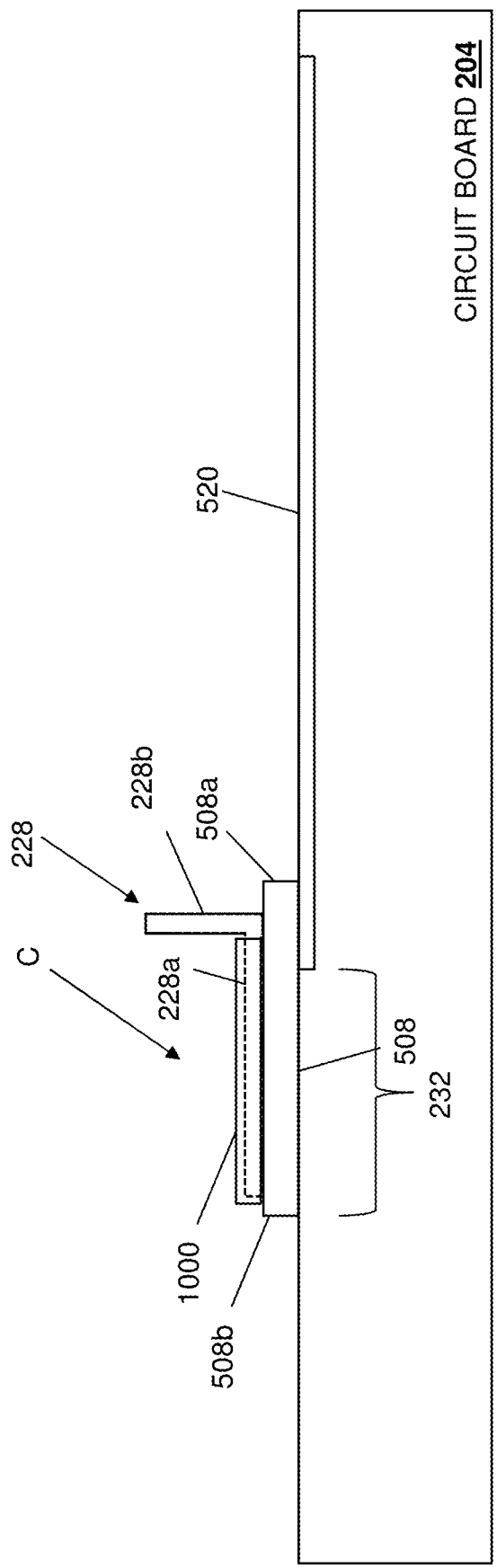
FIG. 10 is a schematic cross-sectional view illustrating an embodiment of a connector mounted in a first orientation to a conventional mounting surface of a conventional connector pad, while including a resonance-reducing mask of the present disclosure.

In various embodiments of method 700, a solder mask may be applied on the connector pad to reduce the resonance that is produced by an open portion of a signal transmission path that is created when the coupling element is directly mounted to the mounting surface of the connector pad in a first orientation that creates that open portion. With reference to FIG. 10, an embodiment of the connector lead frame 228 mounted to the conventional positive pad 208 in the third orientation C is illustrated, and one of skill in the art in possession of the present disclosure will recognize from the discussion above how a user mounting the connector lead frame 228 to the positive pad 208 may be unaware that the signal transmission line 220 is received by that positive pad 208 adjacent the end 208a, and may orient the connector lead frame 228 incorrectly in the third mounting orientation C that results in an open portion 232 that produces a resonance when high speed signals are transmitted along that signal transmission path.

In an embodiment, a mask 1000 may be applied to any exposed surface of the positive pad 208, as well as the mounting portion 228a of the connector lead frame 228 that engages the positive pad 208. For example, the mask may be a solder mask that may include an epoxy liquid that is silkscreened through a pattern onto the circuit board 204 such that it covers at least a portion of the positive pad 208. However, in other examples, the solder mask may include a liquid photoimageable solder mask ink, a dry film photoimageable solder mask, and/or any other solder mask that would be apparent to one of skill in the art in possession of the present disclosure. The mask 1000 may be formed over at least a portion of the mounting surface 508c and/or the connector lead frame 228. In a specific embodiment, the mask 1000 may be configured to produce relatively high losses, and thus may include a solder mask with a dissipation factor ($D_f$) of approximately 0.1 (e.g., 0.1 or greater) In comparison, conventional solder masks for SMT connectors typically include a $D_f$ that is around 0.01 in order to reduce the insertion losses and reflection losses in the signal transmission path that are caused by the solder mask. However, as discovered by the inventors of the present disclosure, providing a solder mask with a higher $D_f$ operates to reduce total insertion losses and return losses by reducing the amount of insertion losses and/or return losses generated due to the resonance of the open portion 232 of the signal transmission path produced by particular orientations of connector elements on connector pads. As such, return losses and insertion losses in high speed signals that are produced due to resonance (e.g., via the connector lead frame 228, the positive pad 208, and the mask 1000 in the third mounting orientation C) will decrease relative to systems that include conventional connector pads having a relatively low-loss or lossless surface. The signals will produce an insertion loss graph 1200 with cable insertion losses similar to those of plot 1204 in FIG. 12 and produce an eye diagram that is an improvement to the eye diagram 302 illustrated in FIG. 3B.

Figure 11:
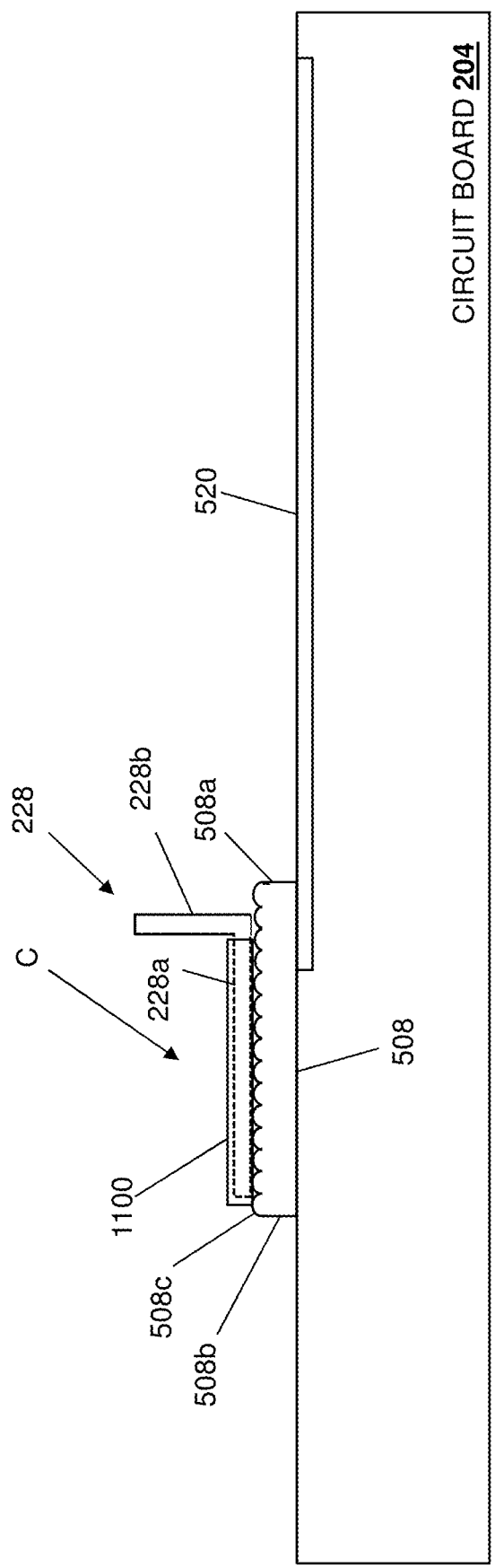
FIG. 11 is a schematic cross-sectional view illustrating an embodiment of a connector mounted in a first orientation to a mounting surface of a connector pad of the present disclosure, while including a resonance-reducing mask of the present disclosure.

With reference to FIG. 11, an embodiment of the connector lead frame 228 mounted to the positive pad 508 in the third orientation C is illustrated, and one of skill in the art in possession of the present disclosure will recognize from the discussion above how a user mounting the connector lead frame 228 to the positive pad 508 may be unaware that the signal transmission line 520 is received by that positive pad 508 adjacent the end 508a, and may orient the connector lead frame 228 incorrectly in the third mounting orientation C that results in an open portion 232 that produces a resonance when high speed signals are transmitted along that signal transmission path. In an embodiment, a mask 1100 may be applied to any exposed surface of the positive pad 508, the mounting surface 508c, and the mounting portion 228a of the connector lead frame 228 that engages the positive pad 508. As such, return losses and insertion losses in high speed signals (transmitted via the connector lead frame 228, the positive pad 208, and the mask 1100 in the third mounting orientation C) due to resonance will decrease relative to systems that utilize conventional connector pads with relatively low-loss or lossless surfaces. The signals will produce an insertion loss graph 1200 with cable insertion losses similar to those of plot 1204 in FIG. 12 and produce an eye diagram that is an improvement to the eye diagram 302 illustrated in FIG. 3B.

Figure 12:
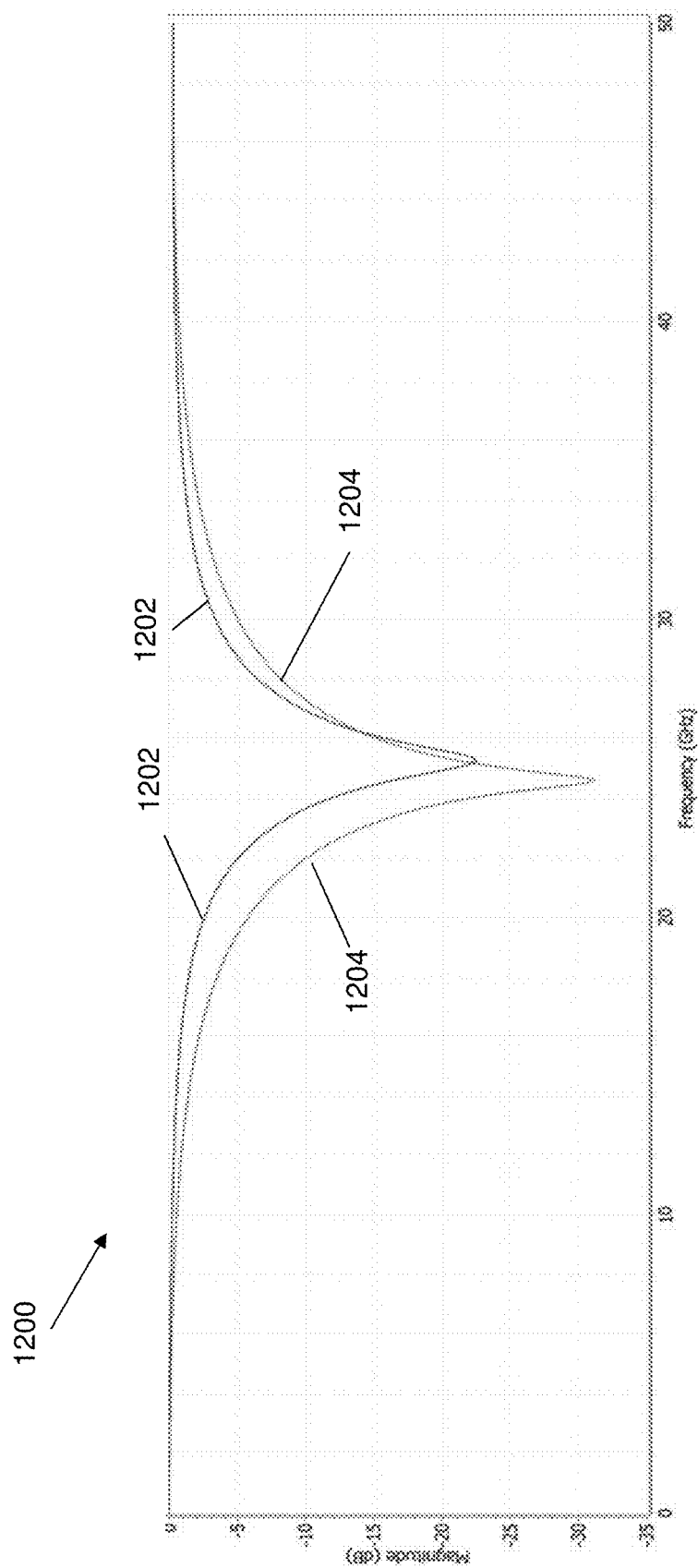
FIG. 12 is a graph illustrating an embodiment of insertion losses that may be introduced due to resonance provided using the systems and methods of the present disclosure and as compared to conventional connector pads.

Referring now to FIG. 12, an insertion loss graph 1200 is provided that plots insertion losses between a transmitter and a receiver via a signal transmission path that includes the conventional positive pad 208 discussed above with reference to FIGS. 2A-2E, as well as a signal transmission path that includes an experimental embodiment of the positive pad 508 having the mounting surface 508c discussed above with reference to FIGS. 5A and 5B. The insertion loss of the transmission path that includes the conventional positive pad 208 is plotted on the insertion loss graph 1200 of loss vs. frequency as plot 1202, while the insertion loss of the transmission path that includes the experimental positive pad 508 of the present disclosure (as illustrated in FIG. 5B) is plotted on the graph 1200 as plot 1204. As can be seen, the insertion losses over the frequency range illustrated in FIG. 12 were substantially reduced (e.g., −33%) for the positive pad 508 according to the present disclosure relative to the conventional positive pad 208.

Thus, systems and methods have been described that provide connector pads on a circuit board that include a mounting surface that mounts to a coupling element, and that is configured to reduce resonance when the coupling element is mounted to the connector pad in an orientation that creates an open portion of a signal transmission path that resonates when a signal is transmitted along that signal transmission path. As such, the connector pads of the present disclosure allow computing device manufacturers to route signal transmission lines such that they are received by connector pads at one end of the connector pad, and users may couple connectors and/or exposed cable ends to that connector pad in different orientations that include a conventional undesirable orientation that introduces an open portion in the signal transmission path that typically resonates and reduces the quality of the high speed signal transmitted via that signal transmission path. By lowering the conductivity of the connector pad via a roughened mounting surface, a plated mounting surface, and/or a mask, it has been discovered that the signal integrity issues generated by conventional connector pads due to such connector-element-orientation-based resonance is reduced, despite the lowered conductivity of the connector pad introducing return losses and insertion losses into the signal transmission path. Furthermore, the systems and methods of the present disclosure do not compromise the mechanical rigidity of the connector pad, as the connector pad dimensions do not need to change the area of the mounting surface that mounts to the coupling element, while lower crosstalk coupling between adjacent connector pads is reduced as well.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A circuit board pad resonance dampening system, comprising:
   a board;
   a signal transmission line included on the board; and
   a plurality of connector pads that are positioned on the board and that include:
      a first connector pad that receives the signal transmission line adjacent a first end of the first connector pad, wherein the first connector pad includes a mounting surface that includes a plurality of protrusions each having a height that provides a variation in the mounting surface between 20 micrometers and 50 micrometers and that is configured to mount directly to a coupling element that is configured to couple a subsystem to the board such that an open portion of a signal transmission path is created when the coupling element is directly mounted to the mounting surface of the first connector pad in a first orientation.

2. The system of claim 1, wherein the plurality of connector pads include a second connector pad that is located adjacent the first connector pad such that no other connector pads are positioned between the first connector pad and the second connector pad, wherein a first conductivity of the mounting surface being less than a second conductivity of the at least the portion of the first connector pad reduces crosstalk coupling between the first connector pad and the second connector pad when a signal is transmitted to the first connector pad via the signal transmission line.

3. The system of claim 1, further comprising:
the coupling element mounted to the first connector pad in the first orientation such that a connector lead portion included on the coupling element is positioned adjacent the first end of the first connector pad and a mounting portion of the coupling element extends away from the first end of the first connector pad and mounts to the mounting surface.

4. The system of claim 3, wherein the mounting surface includes a mask over at least a portion of the first connector pad and the mounting portion.

5. The system of claim 1, wherein the mounting surface has a first conductivity that is less than a second conductivity of at least a portion of the first connector pad.

6. An Information Handling System (IHS), comprising:
a circuit board;
a processing system mounted to the circuit board;
a memory system mounted to the circuit board and coupled to the processing system through the circuit board;
a signal transmission line included on the circuit board and coupled to the processing system; and
a plurality of connector pads that are positioned on the circuit board and that include:
a first connector pad that receives the signal transmission line adjacent a first end of the first connector pad, wherein the first connector pad includes a mounting surface that includes a plurality of protrusions each having a height that provides a variation in the mounting surface between 20 micrometers and 50 micrometers and that is configured to mount directly to a coupling element that is configured to couple a subsystem to the circuit board such that an open portion of a signal transmission path is created when the coupling element is directly mounted to the mounting surface of the first connector pad in a first orientation.

7. The IHS of claim 6, wherein the plurality of connector pads include a second connector pad that is located adjacent the first connector pad such that no other connector pads are positioned between the first connector pad and the second connector pad, wherein a first conductivity of the mounting surface being less than a second conductivity of the at least the portion of the first connector pad reduces crosstalk coupling between the first connector pad and the second connector pad when a signal is transmitted to the first connector pad via the signal transmission line.

8. The IHS of claim 6, further comprising:
the coupling element mounted to the first connector pad in the first orientation such that a connector lead portion included on the coupling element is positioned adjacent the first end of the first connector pad and a mounting portion of the coupling element extends away from the first end of the first connector pad and mounts to the mounting surface.

9. The IHS of claim 8, wherein the mounting surface includes a mask over at least a portion of the first connector pad and the mounting portion.

10. The IHS of claim 6, wherein the mounting surface has a first conductivity that is less than a second conductivity of at least a portion of the first connector pad.

11. A method for controlling resonance on a circuit board connector pad, comprising:
providing, on a board, a first connector pad that includes a first end;
routing, on the board, a signal transmission line such that the signal transmission line is received adjacent the first end of the first connector pad; and
forming a plurality of protrusions on a mounting surface on the first connector pad that is configured to mount directly to a coupling element that is configured to couple a subsystem to the board such that an open portion of a signal transmission path is created when the coupling element is directly mounted to the mounting surface of the first connector pad in a first orientation, wherein each of the plurality of protrusions has a height that provides a variation in the mounting surface between 20 micrometers and 50 micrometers.

12. The method of claim 11, further comprising: forming a plated mounting surface on the mounting surface, wherein the plated mounting surface includes a conductivity that is less than a conductivity of the first connector pad.

13. The method of claim 11, further comprising:
coupling the coupling element to the first connector pad in the first orientation such that a connector lead portion included on the coupling element is positioned adjacent the first end of the first connector pad and a mounting portion of the coupling element extends away from the first end of the first connector pad and mounts to the mounting surface.

14. The method of claim 13, further comprising:
forming a mask over at least a portion of the first connector pad and the mounting portion.

15. The method of claim 11, wherein the mounting surface has a first conductivity that is less than a second conductivity of at least a portion of the first connector pad.

* * * * *